(12) United States Patent
Sancon

(10) Patent No.: US 11,545,231 B2
(45) Date of Patent: Jan. 3, 2023

(54) RESET READ DISTURB MITIGATION

(71) Applicant: Micron Technology, Inc., Boise, ID (US)

(72) Inventor: John Christopher M. Sancon, Boise, ID (US)

(73) Assignee: Micron Technology, Inc., Boise, ID (US)

(*) Notice: Subject to any disclaimer, the term of this patent is extended or adjusted under 35 U.S.C. 154(b) by 97 days.

(21) Appl. No.: 17/171,838

(22) Filed: Feb. 9, 2021

(65) Prior Publication Data

US 2022/0254430 A1 Aug. 11, 2022

(51) Int. Cl.
| | |
|---|---|
| G11C 29/42 | (2006.01) |
| G11C 29/44 | (2006.01) |
| G11C 7/06 | (2006.01) |
| G11C 7/10 | (2006.01) |
| H03K 19/20 | (2006.01) |

(52) U.S. Cl.
CPC .............. *G11C 29/42* (2013.01); *G11C 7/062* (2013.01); *G11C 7/065* (2013.01); *G11C 7/1039* (2013.01); *G11C 29/44* (2013.01); *H03K 19/20* (2013.01)

(58) Field of Classification Search
CPC ......... G11C 29/42; G11C 7/062; G11C 7/065; G11C 7/1039; G11C 29/44; H03K 19/20
See application file for complete search history.

(56) References Cited

U.S. PATENT DOCUMENTS

| | | | |
|---|---|---|---|
| 7,514,975 B2* | 4/2009 | Frederick, Jr. ... | H03K 3/356008 327/202 |
| 9,305,611 B2* | 4/2016 | Chang ..................... | G11C 5/145 |
| 2018/0204606 A1* | 7/2018 | Kojima .................... | G11C 7/12 |
| 2018/0366201 A1* | 12/2018 | Murakami ........... | G11C 29/026 |
| 2020/0098422 A1* | 3/2020 | Nguyen .................. | G11C 8/08 |

* cited by examiner

*Primary Examiner* — Tri M Hoang
(74) *Attorney, Agent, or Firm* — Fletcher Yoder, P.C.

(57) ABSTRACT

Methods and systems include memory devices having multiple memory cells configured to store data. The memory devices also include control circuitry including retry circuitry. The retry circuitry is configured to receive a read command having a target address. The retry circuitry is also configured to determine that the target address of the data stored in the memory cells is to be reused from a previous read operation. Additionally, the retry circuitry is configured to cause reading of the data from a sense amplifier latch from the previous read operation by reusing the target address. Specifically, reusing the target address includes bypassing rereading the data into the sense amplifier latch from the memory cells for a current read operation.

25 Claims, 7 Drawing Sheets

RESET READ DISTURB MITIGATION

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Generally, a computing system includes processing circuitry, such as one or more processors or other suitable components, and memory devices, such as chips or integrated circuits. One or more memory devices may be used on a memory module, such as a dual in-line memory module (DIMM), to store data accessible to the processing circuitry. For example, based on a user input to the computing system, the processing circuitry may request that a memory module retrieve data corresponding to the user input from its memory devices. In some instances, the retrieved data may include firmware, or instructions executable by the processing circuitry to perform an operation and/or may include data to be used as an input for the operation. In addition, in some cases, data output from the operation may be stored in memory, such as to enable subsequent retrieval of data from the memory.

Some memory devices include memory cells that may be accessed by turning on a transistor that couples the memory cell (e.g., a capacitor) with a wordline or a bitline. In contrast, threshold-type memory devices include memory devices that are accessed by providing a voltage across a memory cell, where the data value is stored based on the threshold voltage of the memory cell. For example, the data value may be based on whether the threshold voltage of the memory cell is exceeded and, in response to the voltage provided across the memory cell, the memory cell conducts current. The data value stored may be changed, such as by applying a voltage sufficient to change the threshold voltage of the memory cell. One example of a threshold-type memory cell may be a cross-point memory cell.

With threshold-type memories, the threshold voltage (VTH) determines when certain actions are performed. However, this threshold may suffer from reliability issues on read disturb on resets (RDR) destroying a poling effect by soft programming an opposite polarity. Specifically, the reliability issues may result in a cumulative VTH degradation (e.g., decrease in VTH) as numbers of read disturbs increase until memory operations fail. These reliability issues may be larger or more problematic for some aspects of the memory device, such as a read disturb on reset (RDR), than for other aspects (e.g., write operations).

BRIEF DESCRIPTION OF THE DRAWINGS

Various aspects of this disclosure may better be understood upon reading the following detailed description and upon reference to the drawings in which.

DETAILED DESCRIPTION

Figure 1:
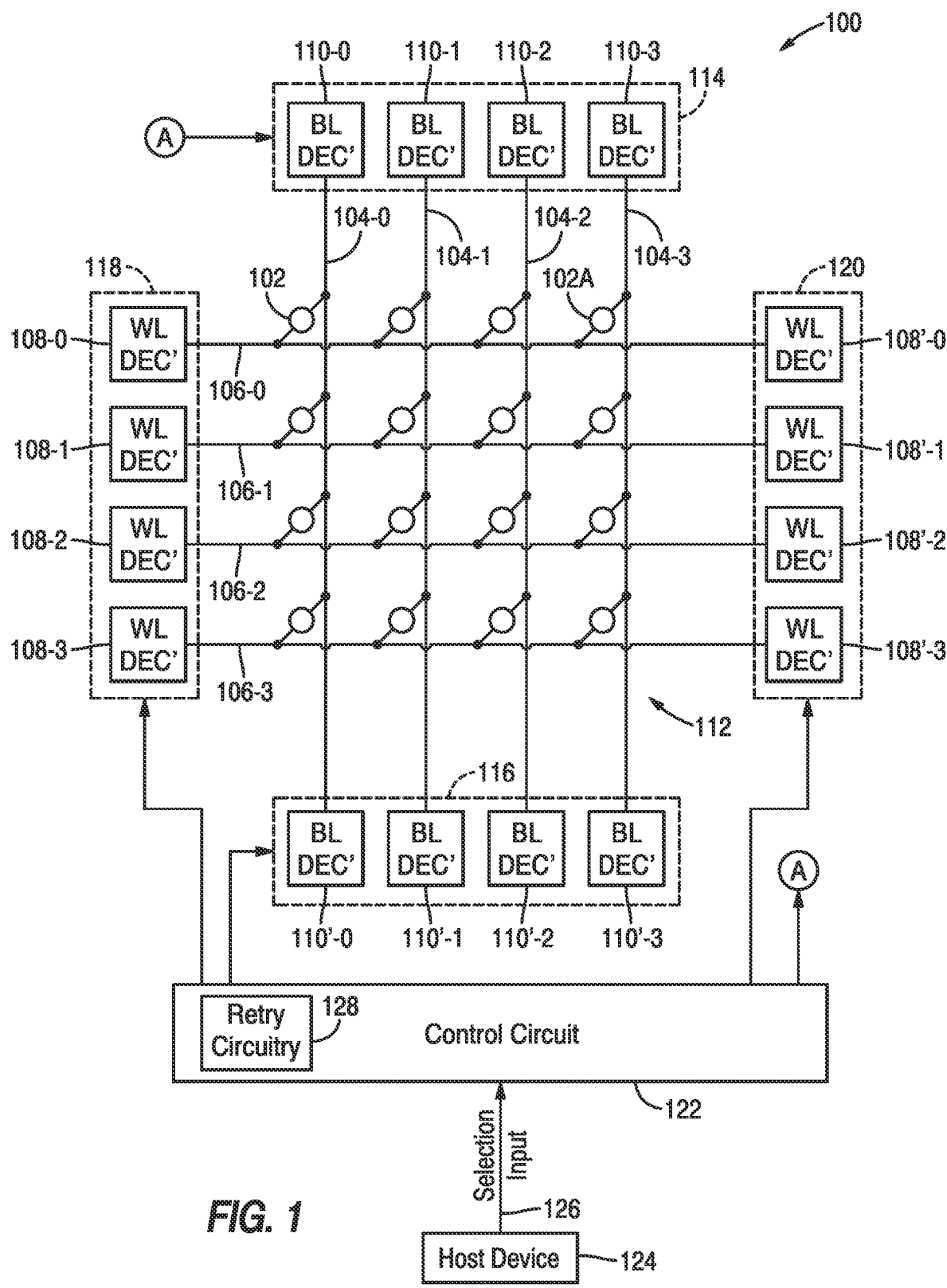
FIG. 1 is a simplified block diagram illustrating certain features of a memory device including retry circuitry and a memory array of memory cells, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Memories generally include an array of memory cells, where each memory cell is coupled between at least two access lines. For example, a memory cell may be coupled to access lines, such as a bitline and a wordline. Each access line may be coupled to a large number of memory cells. To select a memory cell, one or more drivers may provide selection signals (e.g., a voltage and/or a current) on the access lines to access storage capacities of the memory cell. By applying voltages and/or currents to the respective access lines, the memory cell may be accessed, such as to write data to the memory cell and/or read data from the memory cell.

In some memories, memory cells of the array may be organized into decks of memory cells. A deck of memory cells may be a single plane of memory cells disposed between a layer of wordlines and a layer of bitlines. The array may be a stack of decks that includes any number of decks of memory cells (e.g., 0 decks, 1 deck, 2 decks, 4 decks, any number of decks) as different layers of the array.

Within a deck, a two-dimensional array of memory cells may be arranged at different intersections of the wordlines and the bitlines in the plane. As previously noted for threshold-type memories, the threshold voltage (VTH) may suffer from reliability issues on read disturb on resets (RDRs) destroying a poling effect by soft programming an opposite polarity. Specifically, the reliability issues may result in a cumulative VTH degradation (e.g., decrease in VTH) as numbers of read disturbs increase until the memory operations repeatedly fail. Re-reading a same (or other)

address in a partition shortly after a previous read in the partition may exacerbate the VTH degradation. Instead, a minimum read-to-read (mR2R) duration may be specified as a minimum time between reads to the partition (and/or address). A short mR2R duration for a same partition may exacerbate the VTH degradation, but overlong mR2R durations may impact performance of the memory device. To provide RDR-based degradation mitigation with enhanced performance, re-reading of a sense amplifier latch may be utilized without running the read process on the same physical cell locations if the data is already in the sense amplifier latch. The read process may include propagating clocks, currents, and/or voltages that consume power and/or may cause degradation of the memory device unless avoided using the sense amplifier latch re-read. Some situations (e.g., error correction code errors, change in demarcation voltage (VDM)) may cause the memory device to forego such re-reads by instead utilizing the read process through the array since the data in the sense amplifier latch may no longer be considered to match the data in the memory cell.

Keeping the foregoing introduction in mind, FIG. 1 is a block diagram of a portion of a memory device 100. The memory device 100 may be any suitable form of memory, such as non-volatile memory (e.g., a cross-point memory) and/or volatile memory. The memory device 100 may include one or more memory cells 102, one or more bitlines 104 (e.g., 104-0, 104-1, 104-2, 104-3), one or more wordlines 106 (e.g., 106-0, 106-1, 106-2, 106-3), one or more wordline decoders 108 (e.g., wordline decoding circuitry), and one or more bitline decoders 110 (e.g., bitline decoding circuitry). The memory cells 102, bitlines 104, wordlines 106, wordline decoders 108, and bitline decoders 110 may form a memory array 112.

Each of the memory cells 102 may include a selector and/or a storage element. When a voltage across a selector of a respective memory cell reaches a threshold, the storage element may be accessed to read a data value from and/or write a data value to the storage element. In some embodiments, each of the memory cells 102 may not include a separate selector and storage element, and have a configuration such that the memory cell nonetheless acts as having a selector and storage element (e.g., may include use of a material that behaves both like a selector material and a storage element material). For ease of discussion, FIG. 1 may be discussed in terms of bitlines 104, wordlines 106, wordline decoders 108, and bitline decoders 110, but these designations are non-limiting. The scope of the present disclosure should be understood to cover memory cells 102 that are coupled to multiple access lines and accessed through respective decoders, where an access line may be used to store data into a memory cell and read data from the memory cell 102. Furthermore, the memory device 100 may include other circuitry, such as a biasing circuitry configured to bias the bitlines 104 or wordlines 106 in a corresponding direction. For example, the bitlines 104 may be biased with positive biasing circuitry while the wordlines 106 may be biased with negative biasing circuitry.

The bitline decoders 110 may be organized in multiple groups of decoders. For example, the memory device 100 may include a first group of bitline decoders 114 (e.g., multiple bitline decoders 110) and/or a second group of bitline decoders 116 (e.g., different group of multiple bitline decoders 110). Similarly, the wordline decoders 108 may also be arranged into groups of wordline decoders 108, such as a first group of wordline decoders 118 and/or a second group of wordline decoders 120. Decoders may be used in combination with each other to drive the memory cells 102 (e.g., such as in pairs and/or pairs of pairs on either side of the wordlines 106 and/or bitlines 104) when selecting a target memory cell 102A from the memory cells 102. For example, bitline decoder 110-3 may operate in conjunction with bitline decoder 110'-3 and/or with wordline decoders 108-0, 108'-0 to select the memory cell 102A. As may be appreciated herein, decoder circuitry on either ends of the wordlines 106 and/or bitlines 104 may be different.

Each of the bitlines 104 and/or wordlines 106 may be metal traces disposed in the memory array 112, and formed from metal, such as copper, aluminum, silver, tungsten, or the like. Accordingly, the bitlines 104 and the wordlines 106 may have a uniform resistance per length and a uniform parasitic capacitance per length, such that a resulting parasitic load may uniformly increase per length. It is noted that the depicted components of the memory device 100 may include additional circuitry not particularly depicted and/or may be disposed in any suitable arrangement. For example, a subset of the wordline decoders 108 and/or bitline decoders 110 may be disposed on different sides of the memory array 112 and/or on a different physical side of any plane including the circuitries.

The memory device 100 may also include a control circuit 122. The control circuit 122 may communicatively couple to respective wordline decoders 108 and/or bitline decoders 110 to perform memory operations, such as by causing the decoding circuitry (e.g., a subset of the wordline decoders 108 and/or bitline decoders 110) to generate selection signals (e.g., selection voltage and/or selection currents) for selecting a target of the memory cells. In some embodiments, a positive voltage and a negative voltage may be provided on one or more of the bitlines 104 and/or wordlines 106, respectively, to a target of the memory cells 102. In some embodiments, the decoder circuits may provide biased electrical pulses (e.g., voltage and/or current) to the access lines to access the memory cell. The electrical pulse may be a square pulse, or in other embodiments, other shaped pulses may be used. In some embodiments, a voltage provided to the access lines may be a constant voltage.

Activating the decoder circuits may enable the delivery of an electrical pulse to the target of the memory cells 102 such that the control circuit 122 is able to access data storage of the target memory cell, such as to read from or write to the data storage. After a target of the memory cells 102 is accessed, data stored within storage medium of the target memory cell may be read or written. Writing to the target memory cell may include changing the data value stored by the target memory cell. As previously discussed, the data value stored by a memory cell may be based on a threshold voltage of the memory cell. In some embodiments, a memory cell may be "set" to have a first threshold voltage or may be "reset" to have a second threshold voltage. A set memory cell may have a lower threshold voltage than a reset memory cell. By setting or resetting a memory cell, different data values may be stored by the memory cell. Reading a target of the memory cells 102 may include determining whether the target memory cell was characterized by the first threshold voltage and/or by the second threshold voltage. In this way, a threshold voltage window may be analyzed to determine a value stored by the target of the memory cells 102. The threshold voltage window may be created by applying programming pulses with opposite polarity biasing to the memory cells 102 (e.g., in particular, writing to selector device (SD) material of the memory cell) and reading the memory cells 102 (e.g., in particular, reading a voltage stored by the SD material of the memory cell 102) using a signal with a given (e.g., known) fixed polarity. In some embodiments, a selection input 126 may be received from a host device 124, such as a host processor reading data from/writing data to the memory device 100 to cause the control circuit 122 to access particular memory cells 102 using respective selection signals to respective wordline decoders 108 and bitline decoders 110. In addition, the control circuit 122 may include retry circuitry 128 that may be used to reduce threshold degradation by foregoing portions of a read operation by reading data latched into a sense amplifier latch in a previous read operation without reading data from the memory cells 102 in the current read operation.

Figure 2:
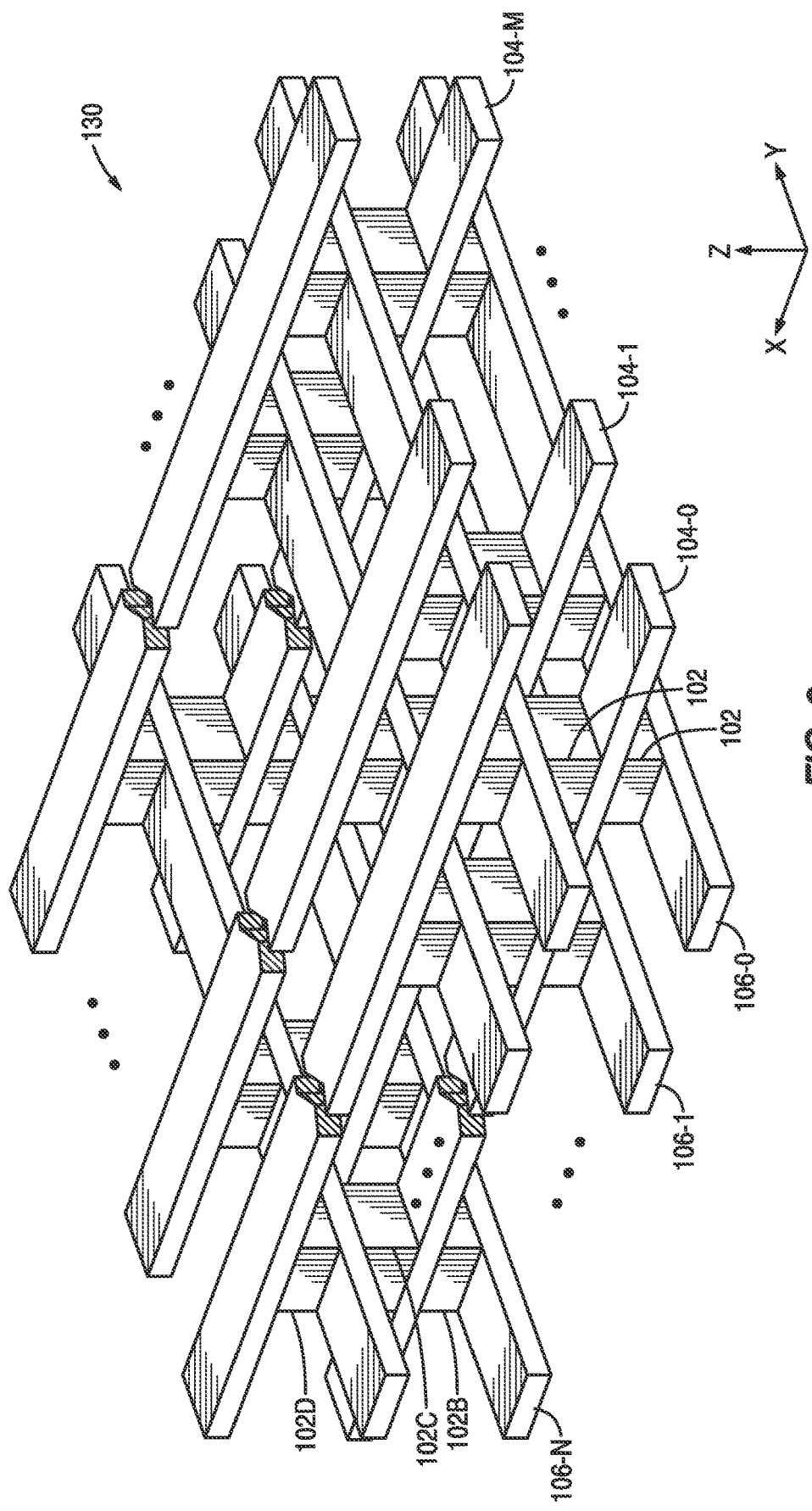
FIG. 2 is a side-view of a diagram illustrating the portion of the memory array of FIG. 1, according to an embodiment of the present disclosure.

FIG. 2 is a diagram illustrating a portion of a memory array 130 in accordance with an embodiment of the present disclosure. Inside the memory array 130, the memory cells are located at intersections of orthogonal lines. The memory array 130 may be a cross-point array including wordlines 106 (e.g., 106-0, 106-1, . . . , 106-N) and bitlines 104 (e.g., 104-0, 104-1, . . . , 104-M). A memory cell 102 may be located at each of the intersections of the wordlines 106 and bitlines 104. The memory cells 102 may function in a two-terminal architecture (e.g., with a particular wordline 106 and the bitline 104 combination serving as the electrodes for the memory cell 102).

Each of the memory cells 102 may be resistance variable memory cells, such as resistive random-access memory (RRAM) cells, conductive-bridging random access memory (CBRAM) cells, phase-change memory (PCM) cells, and/or spin-transfer torque magnetic random-access memory (STT-RAM) cells, among other types of memory cells. Each of the memory cells 102 may include a memory element (e.g., memory material) and a selector element (e.g., a selector device (SD) material) and/or a material layer that functionally replaces a separate memory element layer and selector element layer. The selector element (e.g., SD material) may be disposed between a wordline contact (e.g., a layer interface between a respective one of the wordlines 106 and the memory material) and a bitline contact (e.g., a layer interface between a respective one of the bitlines 104 and the selector element) associated with a wordline or bitline forming the memory cell. Electrical signals may transmit between the wordline contact and the bitline contact when reading or writing operations are performed to the memory cell.

The selector element may be a diode, a non-ohmic device (NOD), or a chalcogenide switching device, among others, or formed similar to the underlying cell structure. The selector element may include, in some examples, selector material, a first electrode material, and a second electrode material. The memory element of memory cell 102 may include a memory portion of the memory cell 102 (e.g., the portion programmable to different states). For instance, in resistance variable memory cells 102, a memory element can include the portion of the memory cell having a resistance that is programmable to particular levels corresponding to particular states responsive to applied programming voltage and/or current pulses. In some embodiments, the memory cells 102 may be characterized as threshold-type memory cells that are selected (e.g., activated) based on a voltage and/or current crossing a threshold associated with the selector element and/or the memory element. Embodiments are not limited to a particular resistance variable material or materials associated with the memory elements of the memory cells 102. For example, the resistance variable material may be a chalcogenide formed of various doped or undoped chalcogenide-based materials. Other examples of resistance variable materials that may be used to form storage elements include binary metal oxide materials, colossal magnetoresistive materials, and/or various polymer-based resistance variable materials, among others.

In operation, the memory cells 102 may be programmed by applying a voltage (e.g., a write voltage) across the memory cells 102 via selected wordlines 106 and bitlines 104. A sensing (e.g., read) operation may be performed to determine a state of one or more memory cells 102 by sensing current. For example, the current may be sensed on one or more bitlines 104/one or more wordlines 106 corresponding to the respective memory cells 102 in response to a particular voltage applied to the selected of the bitlines 104/wordlines 106 forming the respective memory cells 102.

As illustrated, the memory array 130 may be arranged in a cross-point memory array architecture (e.g., a three-dimensional (3D) cross-point memory array architecture) that extends in any direction (e.g., x-axis, y-axis, z-axis). The multi-deck cross-point memory array 130 may include a number of successive memory cells (e.g., 102B, 102C, 102D) disposed between alternating (e.g., interleaved) decks of wordlines 106 and bitlines 104. The number of decks may be expanded in number or may be reduced in number and should not be limited to the depicted volume or arrangement. Each of the memory cells 102 may be formed between wordlines 106 and bitlines 104 (e.g., between two access lines), such that a respective one of the memory cells 102 may be directly electrically coupled with (e.g., electrically coupled in series) with its respective pair of the bitlines 104 and wordlines 106 and/or formed from electrodes (e.g., contacts) made by a respective portion of metal of a respective pair of bitlines 104 and wordlines 106. For example, the memory array 130 may include a three-dimensional matrix of individually-addressable (e.g., randomly accessible) memory cells 102 that may be accessed for data operations (e.g., sense and write) at a granularity as small as a single storage element and/or multiple storage elements. In some cases, the memory array 130 may include more or fewer bitlines 104, wordlines 106, and/or memory cells 102 than shown in the examples of FIG. 2. Each deck may include one or more memory cells 102 aligned in a same plane.

As previously noted, read disturb on reset (RDR) may degrade a respective threshold. Specifically, the second threshold voltage corresponding to the reset may be particularly susceptible to threshold voltage degradation due to RDRs. As previously noted, this degradation may be at least partially due to a destruction of a poling effect by the RDR. Moreover, the amount of degradation may be proportional to the magnitude of the poling effect destructed. Furthermore, the first threshold voltage corresponding to the set may be less susceptible or even immune to such degradations when read disturbs occur on set but may receive some benefit from threshold voltage degradation mitigation. In RDRs, the memory device 100 may have a minimum read-to-read allowance (e.g., 80 ns or 150 ns) for the memory array 130 that may limit a number of RDR counts (e.g., 130 k or 1M) before the cells repeatedly fail. As previously discussed, this threshold degradation may be dependent upon an mR2R duration and/or how frequently a partition (and/or address within a partition) is accessed in read disturbs.

Figure 3:
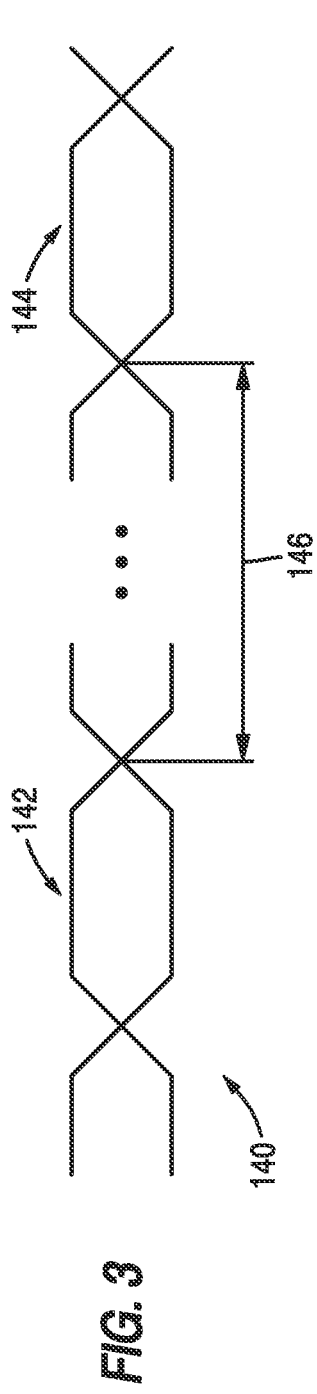
FIG. 3 is a timing diagram of consecutive read operations of a same address in a partition of the memory device of FIG. 1, according to an embodiment of the present disclosure.

FIG. 3 is a timing diagram 140 of a command sequence used in the memory device 100. The timing diagram 140 shows a command 142 and a command 144. For example, the command 142 and the command 144 may be read commands. Each of the commands 142, 144 may specify a partition and an address (including one or more rows and/or columns). For instance, the command 142 and the command 144 may specify a same address inside of a same partition. An mR2R duration 146 may specify a minimum required time delay between reading a first address and a second address (e.g., the first address or another address) in the partition. As previously discussed, a relatively short mR2R duration 146 may exacerbate the RDR-based VTH degradation without mitigation.

Figure 4:
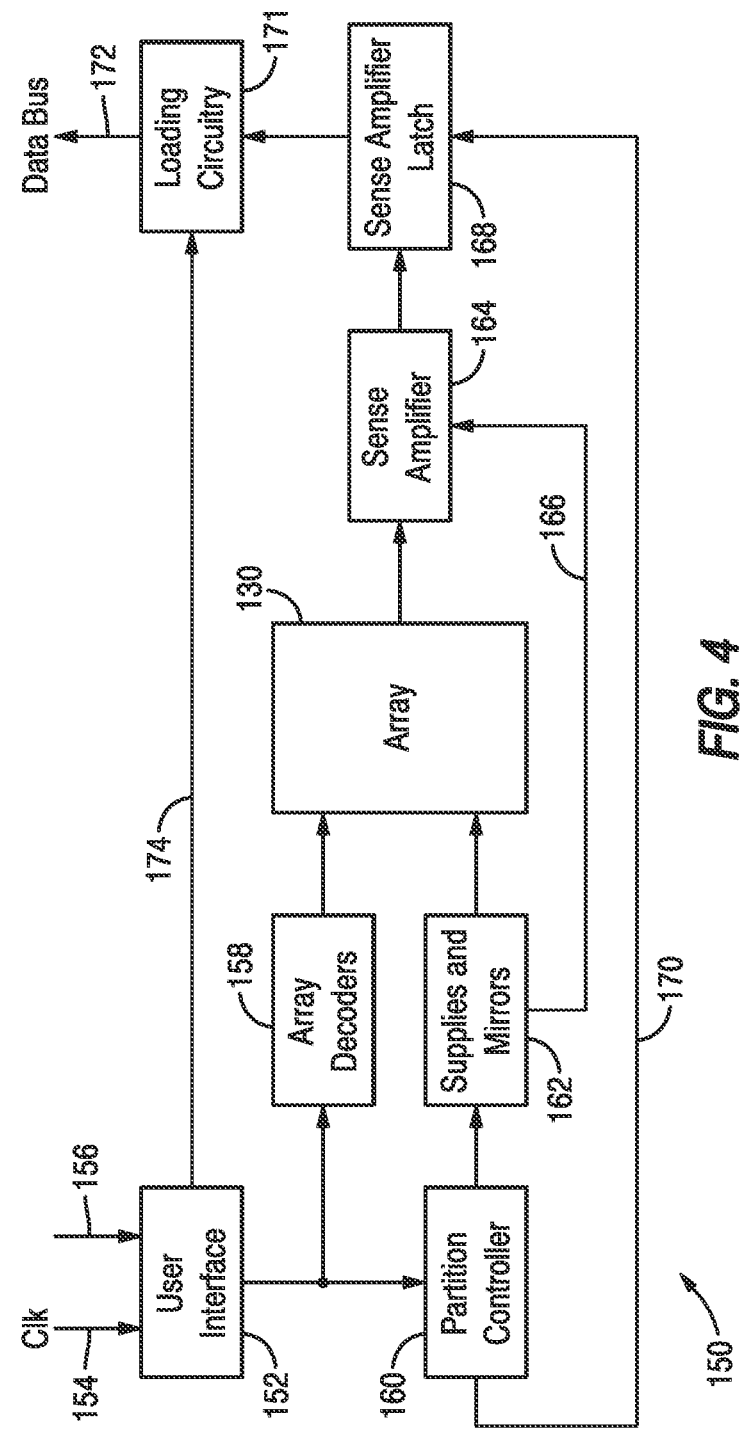
FIG. 4 is a simplified block diagram of a read operation of the memory device of FIG. 1, according to an embodiment of the present disclosure.

FIG. 4 is a block diagram of a read process 150. A user interface 152 of the memory device 100 receives a clock 154 and a read command 156. The user interface 152 may be included in the control circuit 122 with the clock 154 and/or the read command 156 received from the host device 124. The read command 156 may include any read commands, such as command address cycle (CAC) bit(s) (e.g., 8 bits). Upon receipt of the read command 156, the user interface 152 sends a signal to one or more array decoders 158, such as the wordline decoders 108 and the bitline decoders 110. The signal specifies the address and data to the array decoders 158 to enable reading the target memory cells of the memory array 130.

In addition to the signal to the one or more array decoders 158, the user interface 152 sends a signal to a partition controller 160 corresponding to the target of the read command 156. The partition controller 160 controls a sequence of events for a particular partition that is specified in the read command 156 and controls the assertion of positive and/or negative voltages based on a polarity of the read out. Specifically, the partition controller 160 controls supplies and mirrors 162 that are used to propagate voltages and/or currents to the memory array 130 for read operations. The partition controller 160 also controls enablement of a sense amplifier 164 to sense electrical parameters from a memory cell of the memory array 130 and amplify logic levels so that the data in the memory cell may be interpreted properly. The partition controller 160 controls timing and enables the sensing in the sense amplifier 164 using a sensing enable signal 166. The partition controller 160 also enables a sense amplifier latch 168 to latch in a value from the sense amplifier 164 using a latch enable signal 170 when the data from the sense amplifier 164 is ready to be latched.

Loading circuitry 171 is used to load latched values in the sense amplifier latch 168 to a data bus 172 using an enable data drive signal 174 that is timed to load the data after sensing of the memory cell has been completed and latched into the sense amplifier latch 168. The data on the data bus 172 may then be transported back to the host device 124.

Figure 5:
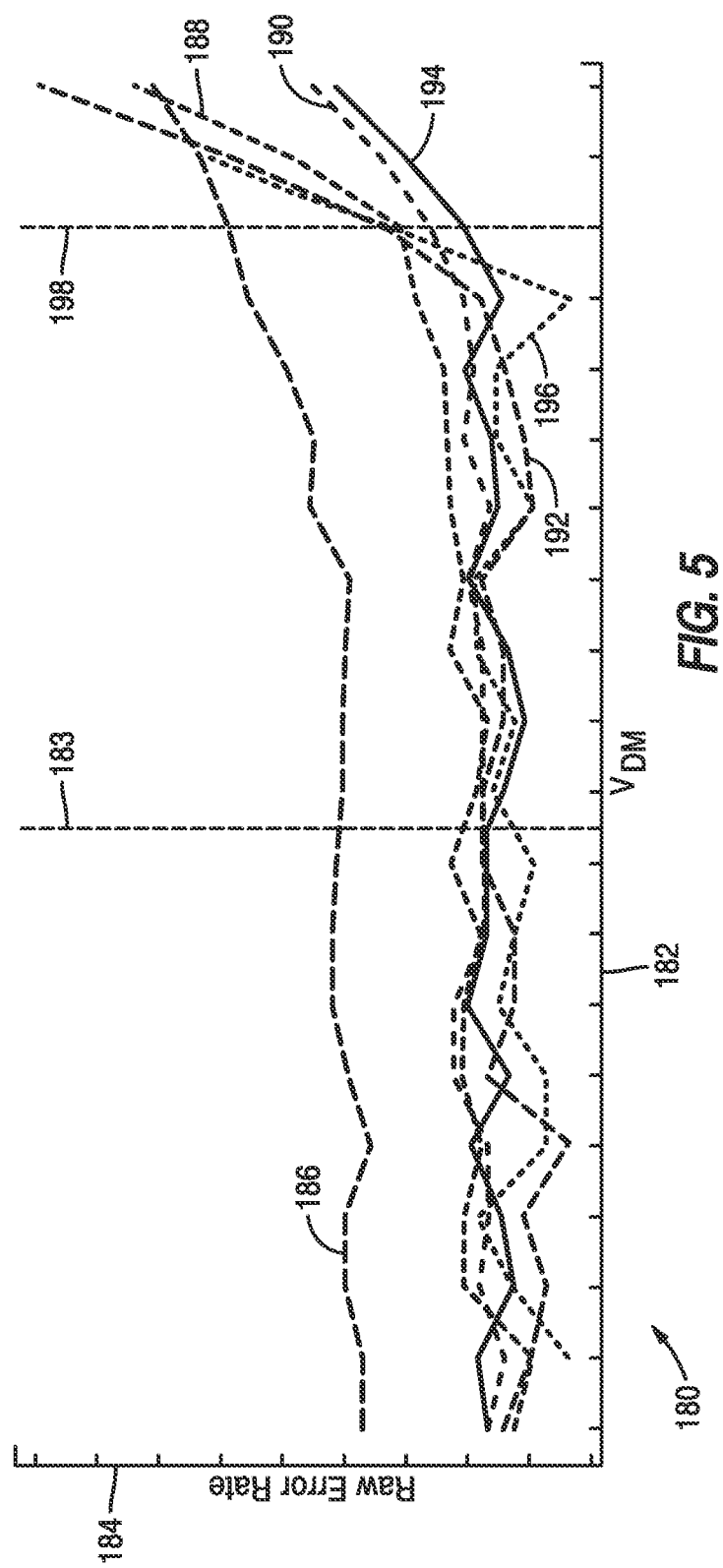
FIG. 5 is a graph of voltages versus raw error rates for different numbers of reads using the timing diagram of FIG. 3, according to an embodiment of the present disclosure.

Using the read process 150 without mitigating for VTH degradation due to RDRs may cause the memory device 100 to function in ways other than those intended. FIG. 5 is a graph 180 that compares possible demarcation voltages 182 (including a stress voltage level 183) to raw error rates 184 (e.g., before application of error correction code) of different RDR counts, each corresponding to lines 186, 188, 190, 192, 194 and 196. For instance, each line may correspond to a different number of reads in rapid succession. For instance, the line 186 may correspond to 130k reads, the line 188 may correspond to 40k reads, the line 190 may correspond to 10k reads, the line 192 may correspond to 1k reads, the line 194 may correspond to 100 reads, and the line 196 may correspond to 2 reads. Generally, an increase in RDRs correlates to higher error rates between the stress voltage level 183 and some demarcation voltage level 198. In addition to the VTH degradation shown, shorter mR2R durations may lead to higher error rates especially for higher demarcation voltages 182.

In some embodiments, the sense amplifier latch 168 may hold data even when the memory device 100 and/or the partition is in an idle mode. Accordingly, as discussed below, in at least some scenarios, the data stuck in the sense amplifier latch 168 from a previous read operation may be retransmitted to the data bus 172 from the sense amplifier latch 168 without reengaging the array decoders 158, the partition controller 160, and/or the supplies and mirrors 162 using a read operation as deployed in the read process 150 of FIG. 4.

Figure 6:
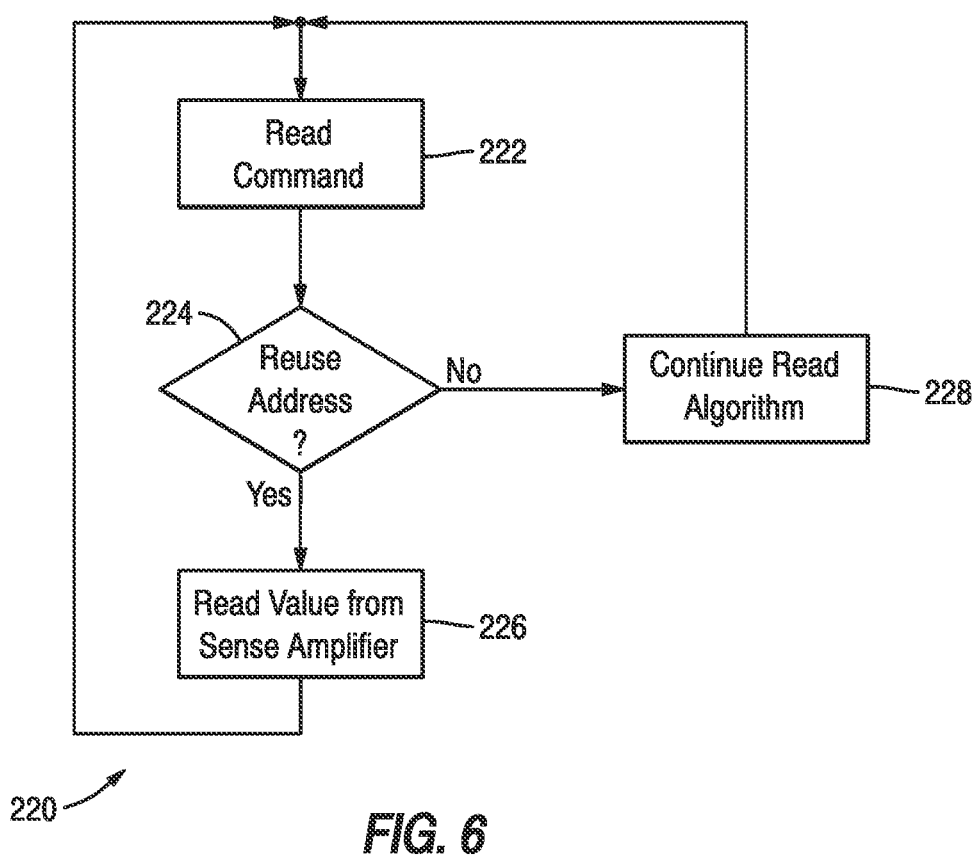
FIG. 6 is a flow diagram of a process for reusing addresses for sense amplifier reads in the memory device of FIG. 1, according to an embodiment of the present disclosure.

FIG. 6 is a flow diagram of a process 220 for mitigating for VDM threshold degradation due to RDRs by reusing data stored in the sense amplifier latch between reads. As illustrated, the process 220 includes receiving a read command (block 222). For instance, the read command may be the read command 156 of FIG. 4 received at the control circuit 122 (e.g., the user interface 152). The retry circuitry 128 in the control circuit 122 then determines whether a previously used address is to be reused with a direct latch read in the reuse of the address (block 224). For instance, the previous address may be reused with a latch read when a previous read used the same address (e.g., row and column) and partition. In some embodiments, the retry circuitry 128 may factor in other considerations for determining whether to read from the sense amplifier latch 168 without a new latch into the sensing amplifier latch 168. For instance, if a re-read is based on an error correction code (ECC) failure (e.g., read-retry), a new CAC bit may indicate that the read process of FIG. 4 is to be re-run without reading from the sense amplifier latch 168 by reusing the address without reading the data from the memory array 130. Similarly, a change in the VDM may also invoke a new run of the read process. When an address is reused, the retry circuitry 128 causes data latched in the sense amplifier latch 168 to be reused without rerunning the read process (block 226). By reusing the address without the read process, the memory array 130 may be disabled along with array decoders 158, supplies and mirrors 162 and their multiplexers, the partition controller 160, and the sense amplifier 164 while elongating a read-to-read duration. Additionally, by reusing the address without causing the memory cell to snap to a voltage level, the memory device 100 may increase the longevity of parts of the memory device 100 before the parts fail. In addition to elongating durations between RDRs to the memory array 130 to mitigate VTH degradation, the read power consumption used in read operations is reduced. If the address is not to be reused, the retry circuitry 128 sends an indication that the memory device 100 is to proceed with the read process as described in the read process 150 of FIG. 4 (block 228). For instance, the retry circuitry 128 may send out the signals to the partition controller 160 and/or the array decoders 158 to continue with the read process 150 discussed in FIG. 4.

Figure 7:
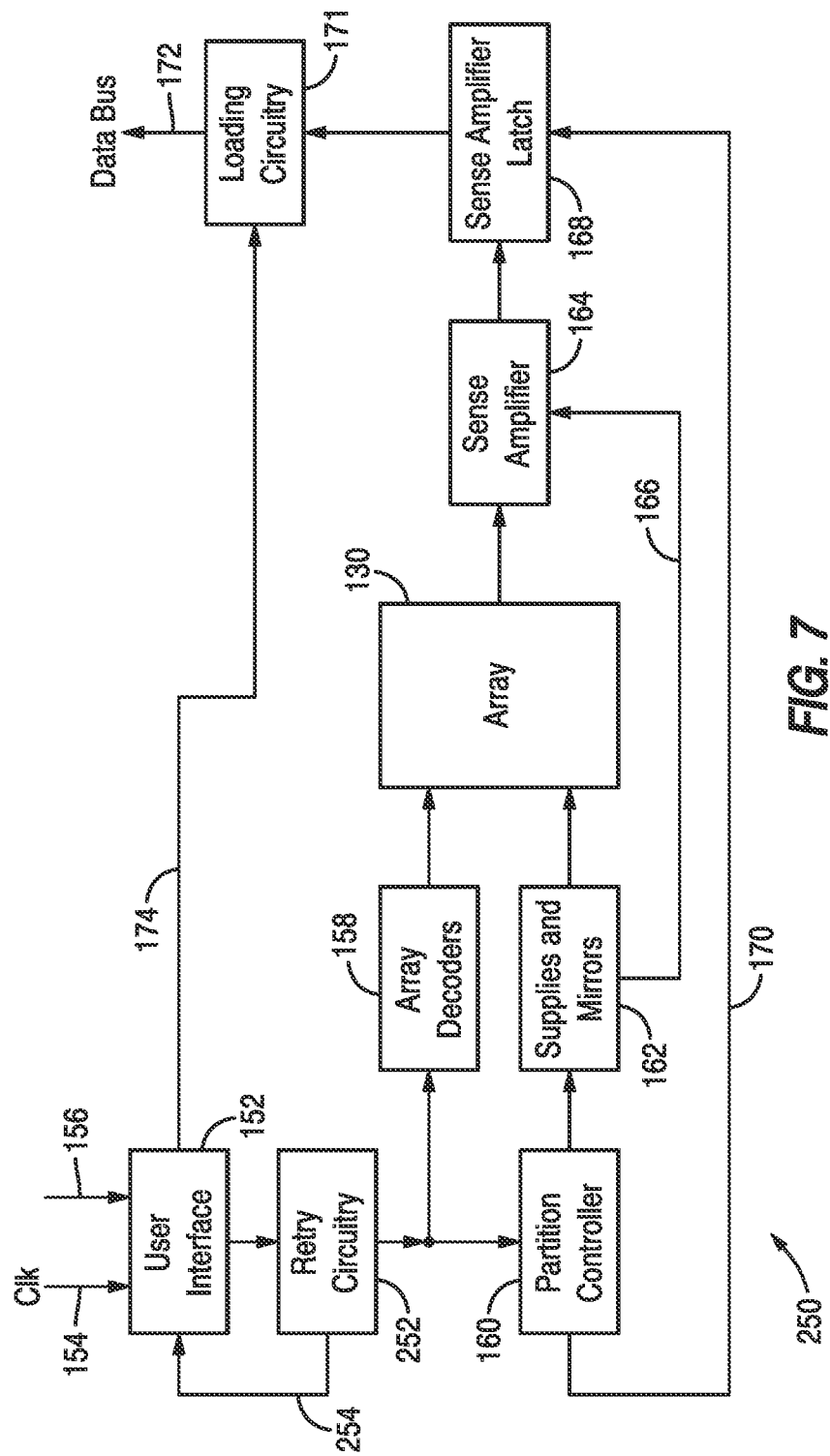
FIG. 7 is a simplified block diagram of a read operation of the memory device of FIG. 1 using the retry circuitry of FIG. 1 to use a value in a sense amplifier latch in consecutive read operations, according to an embodiment of the present disclosure.

FIG. 7 is a simplified block diagram of a read operation 250 that is identical to the read process 150 of FIG. 4 except that the read operation 250 utilizes retry circuitry 252 (e.g., the retry circuitry 128) in between the user interface 152 and the array decoders 158 and the partition controller 160. As previously noted, when the address is to be reused without using the whole read operation used in the read process 150, the retry circuitry 252 suppresses signals from the array decoders 158 and the partition controller 160 to enable the array decoders 158 and the partition controller 160 to stay at least partially inactive. This inactive state also occurs for downstream devices, such as the supplies and mirrors 162, the memory array 130, and the sense amplifier 164. Furthermore, when the address is to be reused, the retry circuitry 252 sends a retry signal 254 to the user interface 152 to send the enable data drive signal 174 from the sense amplifier latch 168 even while the array decoders 158, the partition controller 160, the supplies and mirrors 162, the memory array 130, and the sense amplifier 164 are in inactive states/skipped for the read operation. When the address is not to be reused (i.e., new data to be latched into the sense amplifier latch 168), the retry circuitry 252 causes the rest of the read operation to continue as described in relation to the read process 150 of FIG. 4.

Figure 8:
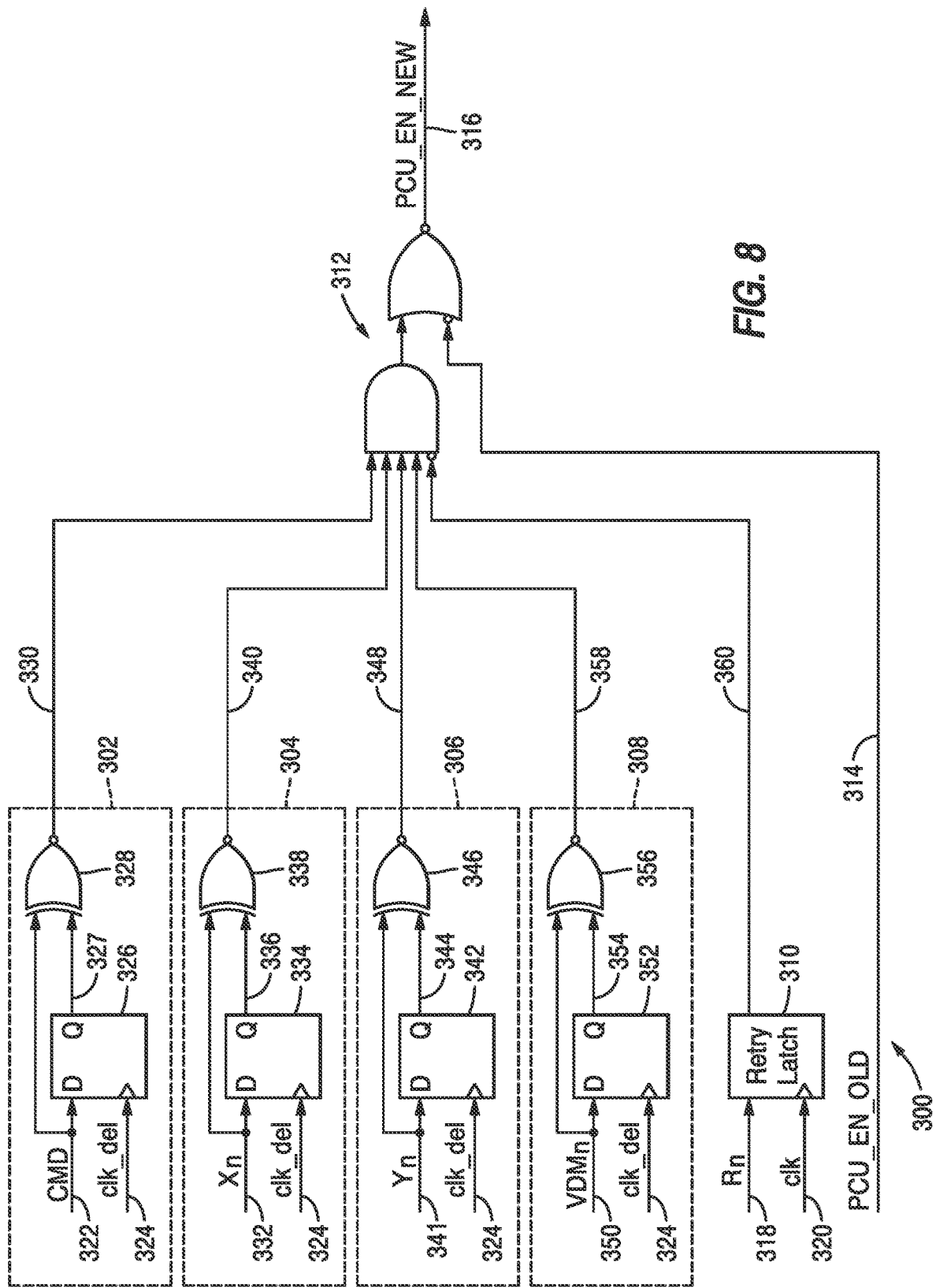
FIG. 8 is a circuit diagram of at least a portion of the retry circuitry of FIG. 1, according to an embodiment of the present disclosure.

FIG. 8 is a schematic diagram of retry circuitry 300 that may be included in the retry circuitry 128 and/or the retry circuitry 252. The retry circuitry 300 may be reproduced in the control circuit 122 for different partitions of the memory device 100. For instance, each partition may have a dedicated retry circuitry 300. Accordingly, the retry circuitry 300 is used to determine whether to reuse an address for a partition while other instances of the retry circuitry 300 may be used for other partitions. The retry circuitry 300 includes command check circuitry 302, row check circuitry 304, column check circuitry 306, VDM check circuitry 308, a retry latch 310, and an intermediate enable signal 314 that are received at a multiplexer 312 to control whether an output enable signal 316 (or other activations of the memory array 130) is to be used to initiate the read process or if the read address is to be re-used. The command check circuitry 302 may check whether an incoming command 322 corresponds to an operation (e.g., read operation) where the address may be re-used and/or has not changed from a last operation. The command check circuitry 302 also receives a delayed clock 324. The delayed clock 324 is delayed to give time to perform the check of the command in one or more command flip-flops 326 without overwriting. The number of command flip-flops 326 (e.g., 2) may be equal to a number of bits in the command 322. The command check circuitry 302 may include an XNOR 328 (or other comparator) that receives an input to command flip-flop 326 as a current command 322 at a first input to the XNOR 328. The XNOR 328 may have a second input that is received from an output 327 of the command flip-flop 326 as a previous command 322. The XNOR 328 outputs an indication 330 of whether the command 322 has changed with each clock cycle of the delayed clock 324. In other words, in the illustrated embodiment, the indication 330 indicates whether a command has changed. Alternatively, the command 322 may be a flag that is based on a received command from the host device 124 that indicates whether the received command pertains to an operation (e.g., read) where the address may be re-used.

The row check circuitry 304 may be used to check if a row address 332 is used again in a read operation. The row check circuitry 304 includes one or more row flip-flops 334. The number of row flip-flops 334 may be equal to a number of bits (e.g., 13) in the row address 332 where each row-flip-flop 334 is coupled to a respective bit of the row address 332. Each row flip-flop 334 outputs an output 336 indicative of the same bit in a previous row address. Each output 336 is coupled to an XNOR 338 (or other comparator) along with the same bit of the row address 332. If the row address 332 has not changed between the previous read operation and the current read operation, each of the XNORs 338 output an indication 340 of no change with a logic high when its respective inputs carry the same values. Otherwise, the indication 340 is a logic low preventing reading from the sense amplifier latch 168 without re-latching data from the memory array 130 via the sense amplifier 164.

The column check circuitry 306 may be used to check if a column address 341 is used again in a read operation. The column check circuitry 306 includes one or more column flip-flops 342. The number of column flip-flops 342 may be equal to a number of bits (e.g., 13) in the column address 341 where each column-flip-flop 342 is coupled to a respective bit of the column address 341. Each column flip-flop 342 outputs an output 344 indicative of the same bit in a previous column address. Each output 344 is coupled to an XNOR 346 (or other comparator) along with the same bit of the column address 341. If the column address 341 has not changed between the previous read operation and the current read operation, each of the XNORs 346 output an indication 348 of no change with a logic high when its respective inputs carry the same values. Otherwise, the indication 348 is a logic low preventing reading from the sense amplifier latch 168 without re-latching data from the memory array 130 via the sense amplifier 164.

The VDM check circuitry 308 may be used to check if a VDM 350 is used again in a read operation. The VDM 350 may be used to specify a VDM for the read operation. The VDM check circuitry 308 includes one or more VDM flip-flops 352. The number of VDM flip-flops 352 may be equal to a number of bits (e.g., 2) in the VDM 350 where each VDM flip-flop 352 is coupled to a respective bit of the VDM 350. Each VDM flip-flop 352 outputs an output 354 indicative of the same bit in a previous VDM setting. Each output 354 is coupled to an XNOR 356 (or other comparator) along with the same bit of the VDM 350. If the VDM 350 has not changed, each of the XNORs 356 output an indication 358 of no change with a logic high when its respective inputs carry the same values. Otherwise, the indication 358 is a logic low preventing reading from the sense amplifier latch 168 without re-latching data from the memory array 130 via the sense amplifier 164.

The retry latch 310 may be used to ensure that no reuse of the address is used for particular operations. A retry flag 318 may be used to indicate that no address reuse is to occur that may be latched into the retry latch 310 with a non-delayed clock 320. For instance, the retry flag 318 may be set to prevent a reuse when the read operation is due to an ECC failure. The enable signal 314 may be used to initiate internal elements in the array decoders 158, the partition controller 160, the supplies and mirrors 162, the memory array 130, and/or the sense amplifier 164.

Using the retry circuitry 300, the memory device 100 may forego initializing the internal elements in the array decoders 158, the partition controller 160, the supplies and mirrors 162, the memory array 130, and/or the sense amplifier 164 when a read to a partition is a same column and row and retry is not disabled by blocking assertion of the enable signal 316. In these cases, the memory device 100 may read from the sense amplifier latch 168 directly without re-latching data from the memory array 130 via the sense amplifier 164. Otherwise, the retry circuitry 300 may use the enable signal 316 to initialize the internal elements in the array decoders 158, the partition controller 160, the supplies and mirrors 162, the memory array 130, and/or the sense amplifier 164 causing data to be latched from the sense amplifier 164 before loading the data onto the data bus 172.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible, or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device, comprising:
a plurality of memory cells configured to store data; and
control circuitry comprising retry circuitry configured to:
  receive a read command having a target address;
  determine that the data in the target address is to be reused from a sense amplifier latch from a previous read operation; and
  cause reading of the data from the sense amplifier latch from the previous read operation by reusing the target address, wherein reusing the target address comprises bypassing rereading the data into the sense amplifier latch from the plurality of memory cells for a current read operation.

2. The memory device of claim 1, wherein the target address comprises a row address and a column address.

3. The memory device of claim 2, wherein the retry circuitry comprises row check circuitry configured to check whether the row address for the current read operation matches the row address for the previous read operation, and the reuse of the target address is based at least in part on the row address for the current read operation matching the row address for the previous read operation.

4. The memory device of claim 3, wherein the row check circuitry comprises:
a flip-flop configured to receive the row address for the current read operation and to output the row address for the previous read operation; and
a comparator configured to receive the row address for the current read operation and the row address for the previous read operation and to determine whether the row address for the current read operation and the row address for the previous read operation match.

5. The memory device of claim 4, wherein the comparator comprises an XNOR gate.

6. The memory device of claim 2, wherein the retry circuitry comprises column check circuitry configured to check whether the column address for the current read operation matches the column address for the previous read operation, and the reuse of the target address is based at least in part on the column address for the current read operation matching the column address for the previous read operation.

7. The memory device of claim 6, wherein column check circuitry comprises:
a flip-flop configured to receive the column address for the current read operation and to output the column address for the previous read operation; and
a comparator configured to receive the column address for the current read operation and the column address for the previous read operation and to determine whether the column address for the current read operation and the column address for the previous read operation match.

8. The memory device of claim 1, wherein the retry circuitry comprises demarcation voltage check circuitry configured to determine whether a demarcation voltage has changed between the previous read operation and the current read operation, and the reuse of the target address is based at least on no change in the demarcation voltage between the previous read operation and the current read operation.

9. The memory device of claim 8, wherein the demarcation voltage check circuitry comprises:
a flip-flop configured to receive an indication of the demarcation voltage for the current read operation and to output an indication of the demarcation voltage for the previous read operation; and
a comparator configured to receive the indication of the demarcation voltage for the current read operation and the indication of the demarcation voltage for the previous read operation and to determine that no change in the demarcation voltage occurred between the previous read operation and the current read operation.

10. The memory device of claim 1, wherein the retry circuitry comprises a retry flip-flop configured to latch a retry signal indicative of whether bypassing rereading the data into the sense amplifier latch from the plurality of memory cells for the current read operation is to be used.

11. The memory device of claim 10, wherein the retry signal is configured to indicate that the previous read operation has failed due to an error correction code error.

12. The memory device of claim 1, wherein the retry circuitry is configured to:
receive a subsequent read command of a subsequent read operation having a second target address;
determine that the second target address does not match the target address;
activate an electrical supply for the plurality of memory cells; and
latch data from the second target address to a corresponding sense amplifier latch using the electrical supply as part of the subsequent read operation.

13. The memory device of claim 1, wherein the plurality of memory cells are organized into a plurality of partitions, wherein the control circuitry comprises an instance of the retry circuitry for each partition of the plurality of partitions.

14. A method, comprising:
receiving a first read command corresponding to a first read operation;
receiving a second read command corresponding to a second read operation after the first read operation;
determining that a row, a column, and a partition correspond to both the first read operation and the second read operation; and
based at least in part on the determination that the row, column, and partition are used for both the first read operation and the second read operation, reading data from a sense amplifier latch for the second read operation without loading the data from a memory array to the sense amplifier latch during the second read operation.

15. The method of claim 14, wherein reading data from the sense amplifier latch for the second read operation without loading the data from the memory array to the sense amplifier latch during the second read operation comprises maintaining an inactive state for the memory array during the second read operation.

16. The method of claim 15, wherein maintaining the inactive state for the memory array comprises maintaining an inactive state for array decoders of the memory array and maintaining an inactive state for electrical supplies for the memory array during the second read operation.

17. The method of claim 15, wherein maintaining the inactive state for the memory array comprises maintaining an inactive state for a partition controller during the second read operation, and wherein the partition controller is configured to control timing of read operations for the partition.

18. A memory device, comprising:
a plurality of memory cells configured to store data;
a plurality of sense amplifiers configured to read from corresponding memory cells of the plurality of memory cells;
a plurality of sense amplifier latches configured to latch outputs from corresponding sense amplifiers of the plurality of sense amplifiers; and
control circuitry comprising retry circuitry configured to:
receive a first read command having a target address;
in response to receiving the first read command, sensing data from the target address using a sense amplifier of the plurality of sense amplifiers;
in response to sensing the data, latching the data from the sense amplifier into a sense amplifier latch of the plurality of sense amplifier latches;
based at least in part on latching the data and the first read command, driving the data from the sense amplifier latch onto a data bus;
receiving a second read command having the target address; and
based at least in part on the second read command after the first read command, re-driving the data from the data from the sense amplifier latch without re-latching the data from the sense amplifier.

19. The memory device of claim 18, wherein re-driving the data from the data from the sense amplifier latch without re-latching the data from the sense amplifier comprises re-driving the data from the sense amplifier latch without re-sensing the data from the target address.

20. The memory device of claim 19, wherein the retry circuitry is configured to:
receive a third read command after the second read command, wherein the third read command has a different target address than the target address;
in response to receiving the third read command, sensing additional data from the different target address using another sense amplifier of the plurality of sense amplifiers;
in response to sensing the additional data, latching the additional data from the other sense amplifier into another sense amplifier latch of the plurality of sense amplifier latches; and
based at least in part on latching the additional data and the third read command, driving the additional data from the other sense amplifier latch onto the data bus.

21. The memory device of claim 18, wherein the plurality of memory cells are arranged into a plurality of partitions, and the first read command, the second read command, and the retry circuitry correspond to a partition of the plurality of partitions.

22. The memory device of claim 21, wherein the control circuitry is configured to:
receive a third read command after the second read command, wherein the third read command has the target address for a different partition of the plurality of partitions;
in response to receiving the third read command, sensing additional data from the target address of the different partition using another sense amplifier of the plurality of sense amplifiers;
in response to sensing the additional data, latching the additional data from the other sense amplifier into another sense amplifier latch of the plurality of sense amplifier latches; and
based at least in part on latching the additional data and the third read command, driving the additional data from the other sense amplifier latch onto the data bus.

23. The memory device of claim 18, wherein the retry circuitry is configured to:
receive a third read command after the second read command, wherein the third read command has the target address;
in response to receiving the third read command, sensing additional data from the target address using the sense amplifier;
in response to sensing the additional data, latching the additional data from the sense amplifier into the sense amplifier latch; and
based at least in part on latching the additional data and the third read command, driving the additional data from the sense amplifier latch onto the data bus.

24. The memory device of claim 23, wherein the third read command corresponds to a re-read of the target address based on an error correction code (ECC)-based fault.

25. The memory device of claim 23, wherein a demarcation voltage for the memory device has changed between the second read command and the third read command.

* * * * *